(12) United States Patent
Raghunathan et al.

(10) Patent No.: US 8,330,511 B2
(45) Date of Patent: Dec. 11, 2012

(54) PLL CHARGE PUMP WITH REDUCED COUPLING TO BIAS NODES

(75) Inventors: Ashwin Raghunathan, Santa Clara, CA (US); Sameer Wadhwa, San Diego, CA (US); Marzio Pedrali-Noy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 191 days.

(21) Appl. No.: 12/763,418

(22) Filed: Apr. 20, 2010

(65) Prior Publication Data

US 2011/0254615 A1 Oct. 20, 2011

(51) Int. Cl.
  *H03L 7/06* (2006.01)
(52) U.S. Cl. ......... 327/158; 327/149; 327/150; 327/159
(58) Field of Classification Search .................. 327/141, 327/144–163, 534–537; 363/59, 60; 331/1 A, 331/15–17; 375/373–376
See application file for complete search history.

(56) References Cited

U.S. PATENT DOCUMENTS

| | | | | |
|---|---|---|---|---|
| 5,334,953 | A * | 8/1994 | Mijuskovic | 331/8 |
| 6,107,849 | A * | 8/2000 | Williams et al. | 327/157 |
| 6,529,082 | B1 * | 3/2003 | Boerstler et al. | 331/17 |
| 6,897,733 | B2 * | 5/2005 | Wakayama | 331/17 |
| 7,012,473 | B1 | 3/2006 | Kokolakis | |
| 7,126,432 | B2 * | 10/2006 | Roubadia et al. | 331/57 |
| 7,812,652 | B2 * | 10/2010 | Mei | 327/156 |
| 2001/0052811 | A1 * | 12/2001 | Kim | 327/536 |
| 2003/0020526 | A1 * | 1/2003 | Ingino, Jr. | 327/157 |
| 2004/0085106 | A1 * | 5/2004 | Jeong | 327/157 |

OTHER PUBLICATIONS

International Search Report and Written Opinion—PCT/US2011/033297—ISA/EPO—Jun. 20, 2011.
Rhee, "Design of High-Performance CMOS Charge Pumps in Phase-Locked Loops", IEEE 1999, pp. II-545-II-548, Newport Beach, California, USA.

* cited by examiner

*Primary Examiner* — Lincoln Donovan
*Assistant Examiner* — Brandon S Cole
(74) *Attorney, Agent, or Firm* — Eric Ho

(57) ABSTRACT

A charge pump includes an UP current mirror and a DN current mirror. The UP current mirror is controlled by an input UP signal and supplies charge onto an output node. The DN current mirror is controlled by an input DN signal and draws charge from the output node. The input UP and DN signals may be received from a phase detector in a Phase-Locked Loop (PLL). To prevent disturbances on bias nodes of the UP and DN current mirrors that otherwise might occur, replica circuits of portions of the UP and DN current mirrors are provided. Each replica circuit is coupled to a bias node of a corresponding current mirror, but is controlled by an input signal of opposite polarity to the input signal that controls the current mirror so that the replica circuit creates disturbances that tend to counteract disturbances created by switching of the current mirror.

20 Claims, 9 Drawing Sheets

PARASITIC CAPACITANCE COUPLING

CHARGE PUMP

CHARGE PUMP
FIRST EMBODIMENT

PARASITIC CAPACITANCE COUPLING

MINIMIZED VOLTAGE DISTURBANCES AT BIAS NODES

CHARGE PUMP
SECOND EMBODIMENT

PLL CHARGE PUMP WITH REDUCED COUPLING TO BIAS NODES

BACKGROUND INFORMATION

1. Technical Field

The disclosed embodiments relate to charge pumps, and more particularly to charge pumps used in Phase-Locked Loops (PLLs).

2. Background Information

PLLs are used in many applications, including use in the local oscillators of cellular telephone receivers and transmitters. PLLs, such as those in the local oscillators of cellular telephones, are often implemented using digital Complementary Metal-Oxide-Semiconductor (CMOS) fabrication processes and often involve ring-type Voltage Controlled Oscillators (VCOs) built with inverter delay elements. Such VCOs typically have high gain when implemented using nanometer CMOS processes. A PLL that uses a high-gain VCO can be stabilized by increasing the loop filter capacitance or by reducing the charge pump current. For a given value of loop filter capacitance, PLLs using these VCO topologies are restricted to using a low value of charge pump current in order to compensate for the large VCO gain. It is challenging to build a charge pump that operates at low current levels with desirable operating characteristics. Charge pump performance at low current levels may be sensitive to second order effects and may suffer due to unwanted coupling of bias nodes to other nodes.

FIG. 1 (Prior Art) is a circuit diagram of a typical charge pump 1 within a PLL. Charge pump 1 receives an up charge pump control signal (UPB) on an input node 2 and a down charge pump control signal (DN) on an input node 3. Signal UPB controls a charge pump up current (IUP), and signal DN controls a charge pump down current (IDN). Nodes 5 and 6 are bias nodes. Charge pump 1 supplies charge onto charge pump output node 4 by conducting a flow of up current (IUP), and by removing charge from charge pump output node 4 by conducting a flow of down current (IDN). The resulting charge pump current pulse train signal ICP is then typically supplied to a loop filter which integrates the pulses thereby generating a Direct Current (DC) signal. The DC signal is supplied to and controls the VCO of the PLL. A charge pump such as charge pump 1 is seen to exhibit non-linear operating characteristics and undesirably low gain when operated at low current levels.

SUMMARY

A charge pump includes an UP current mirror circuit and a DN current mirror circuit. The UP current mirror circuit receives an input UPB signal and in response to the input UPB signal supplies charge onto a charge pump output node. The DN current mirror circuit receives an input DN signal and in response to the input DN signal draws charge from the charge pump output node. The input UPB and DN signals may, for example, be received from a Phase Frequency Detector (PFD) in a Phase-Locked Loop (PLL). To prevent undesirable disturbances to bias voltages on bias nodes of the UP and DN current mirror circuits that otherwise might occur, replica circuits of portions of the UP and DN current mirror circuits are provided. Each replica circuit is coupled to a bias node of a corresponding current mirror circuit, but is controlled to switch in an opposite fashion from the way the current mirror circuit switches such that the replica circuit creates disturbances that tend to counteract the undesirable disturbances created by switching of the current mirror circuit.

In one embodiment, a current mirror circuit includes a first leg and a second leg. The first leg is coupled to the charge pump output node, and current flow in the first leg is controlled by the input signal. When the input signal has a first digital logic level then the current in the first leg is allowed to flow, whereas when the input signal has a second digital logic level then no current flows in the first leg. The magnitude of the mirrored current in the first leg when it is permitted to flow is determined by the magnitude of the current in the second leg. The replica circuit is a replica of the first leg but the replica circuit is controlled by a signal of opposite polarity to the input signal that controls the first leg. The gates of mirror transistors in the first and second legs are coupled together in a current mirror fashion, and are also coupled to a gate of a transistor in the replica circuit. A charge pump may, for example, include a first replica circuit that is coupled to the UP current mirror circuit and may also include a second replica circuit that is coupled to the DN current mirror circuit.

In some embodiments, a replica circuit conducts current (for example, from a supply node to a ground node) in similar fashion to the way the corresponding current mirror circuit conducts current (for example, from the supply node to the charge pump output node or from the charge pump output node to the ground node). In other embodiments, the replica circuit conducts current to and/or from DC voltage nodes other than the supply node and the ground node. In still other embodiments, the replica circuit receives an input switching signal but the replica circuit does not conduct a substantial replica current.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 1:
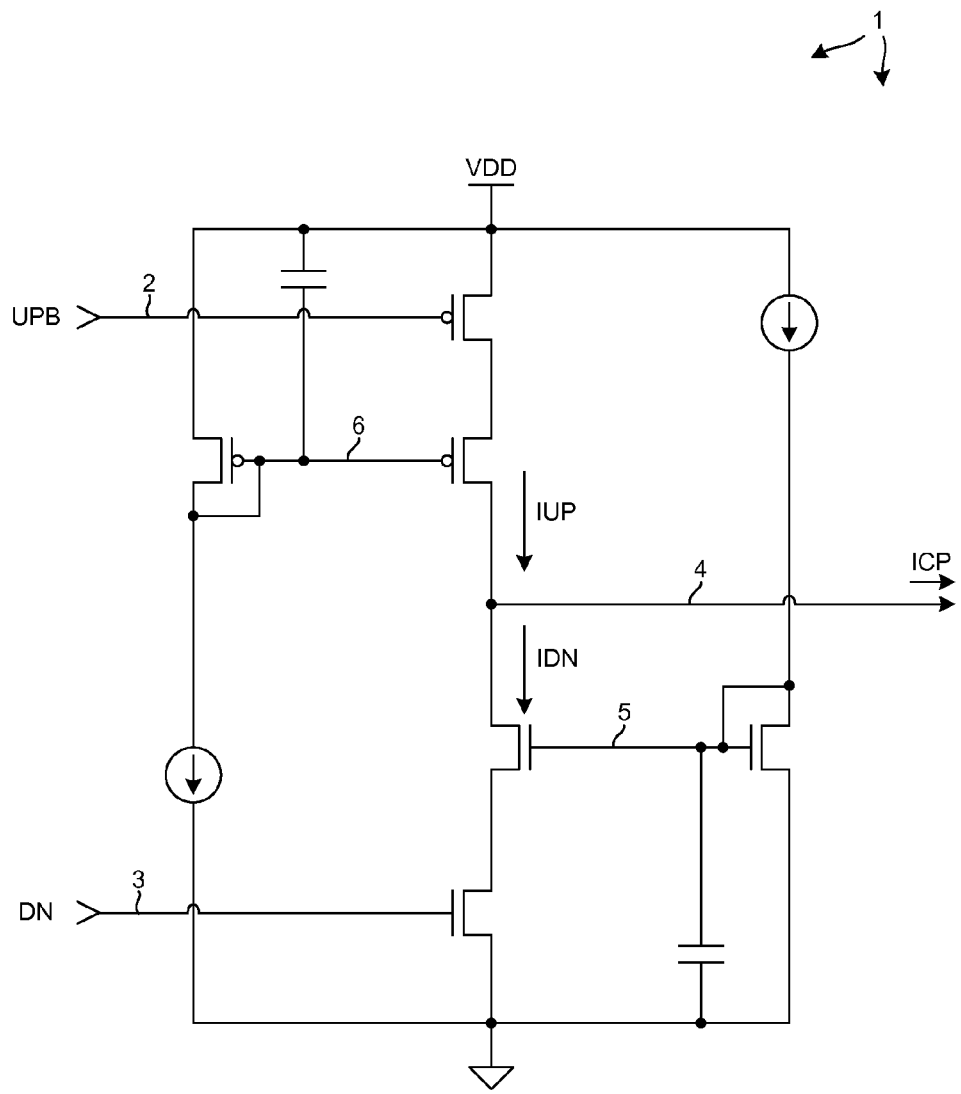
FIG. 1 (Prior Art) is a circuit diagram of a typical charge pump within a PLL.
Figure 2:
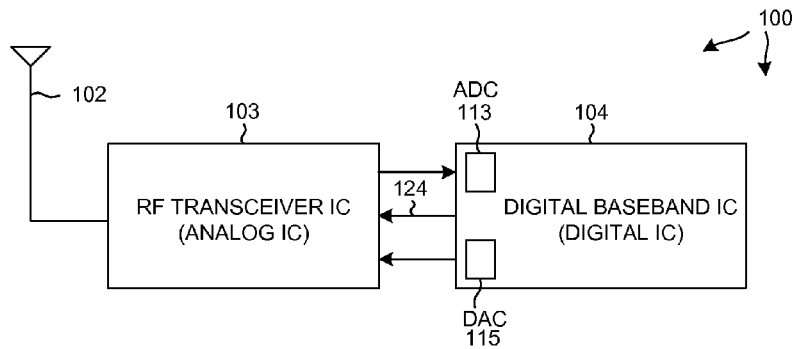
FIG. 2 is a very simplified high level block diagram of one particular type of mobile communication device 100 in accordance with one novel aspect.

FIG. 2 is a very simplified high level block diagram of a mobile communication device 100 in accordance with one novel aspect. In this example, mobile communication device 100 is a cellular telephone. The cellular telephone includes (among several other components not illustrated) an antenna 102 and two integrated circuits 103 and 104. Integrated circuit 104 is called a "digital baseband integrated circuit." Integrated circuit 103 is a Radio Frequency (RF) transceiver integrated circuit. RF transceiver integrated circuit 103 is called a "transceiver" because it includes a transmitter as well as a receiver.

Figure 3:
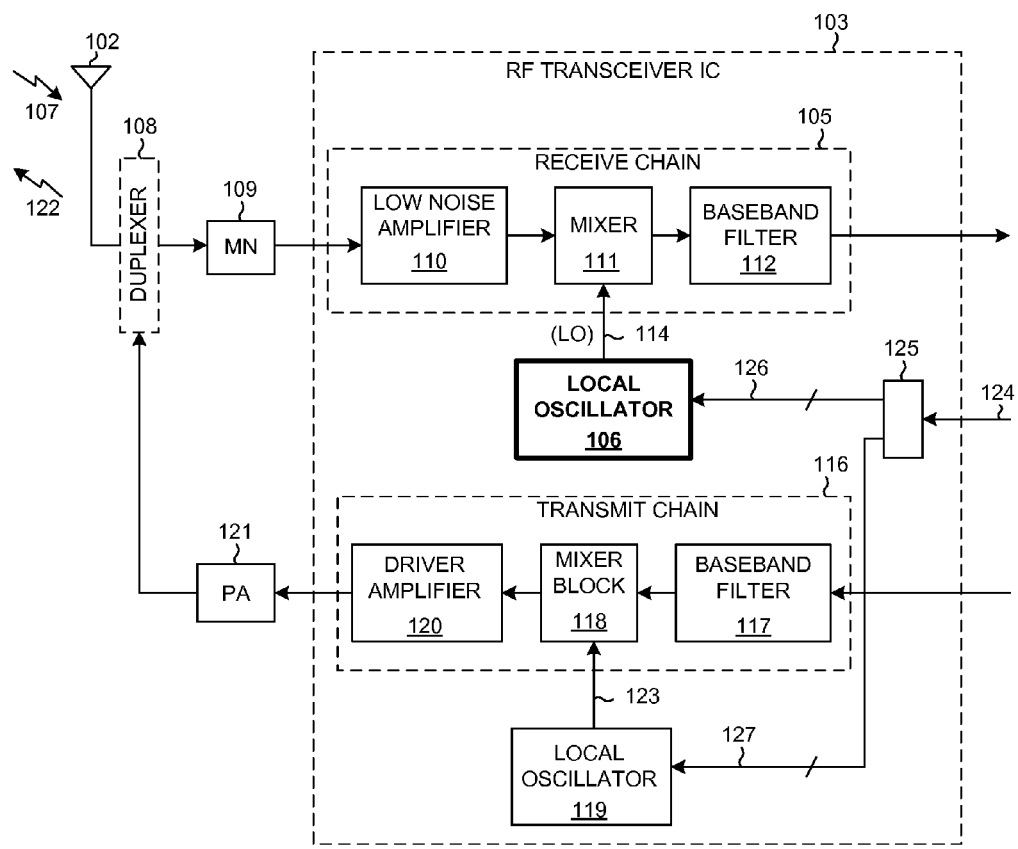
FIG. 3 is a more detailed block diagram of the RF transceiver integrated circuit 103 of FIG. 2.

FIG. 3 is a more detailed block diagram of the RF transceiver integrated circuit 103 of FIG. 2. The receiver includes what is called a "receive chain" 105 as well as a Local Oscillator (LO) 106. When the cellular telephone is receiving, a high frequency RF signal 107 is received on antenna 102. Information from signal 107 passes through duplexer 108, matching network 109, and through the receive chain 105. Signal 107 is amplified by Low Noise Amplifier (LNA) 110 and is down-converted in frequency by mixer 111. The resulting down-converted signal is filtered by baseband filter 112 and is passed to the digital baseband integrated circuit 104. An analog-to-digital converter 113 in the digital baseband integrated circuit 104 converts the signal into digital form and the resulting digital information is processed by digital circuitry in the digital baseband integrated circuit 104. The digital baseband integrated circuit 104 tunes the receiver by controlling the frequency of the Local Oscillator (LO) signal supplied on local oscillator output 114 to mixer 111.

If the cellular telephone is transmitting, then information to be transmitted is converted into analog form by a Digital-to-Analog Converter (DAC) 115 in the digital baseband integrated circuit 104 and is supplied to a "transmit chain" 116 in the RF transceiver integrated circuit 103. Baseband filter 117 then filters out noise due to the digital-to-analog conversion process. Mixer block 118 under control of local oscillator 119 then up-converts the signal into a high frequency signal. Driver amplifier 120 and an external power amplifier 121 amplify the high frequency signal to drive antenna 102 so that a high frequency RF signal 122 is transmitted from antenna 102. The digital baseband integrated circuit 104 controls the transmitter by controlling the frequency of a local oscillator signal supplied on local oscillator output 123 to mixer 118. Digital baseband integrated circuit 104 controls the local oscillators 106 and 119 by sending appropriate control information across a digital bus 124, through bus interface 125, and control lines 126 and 127.

Figure 4:
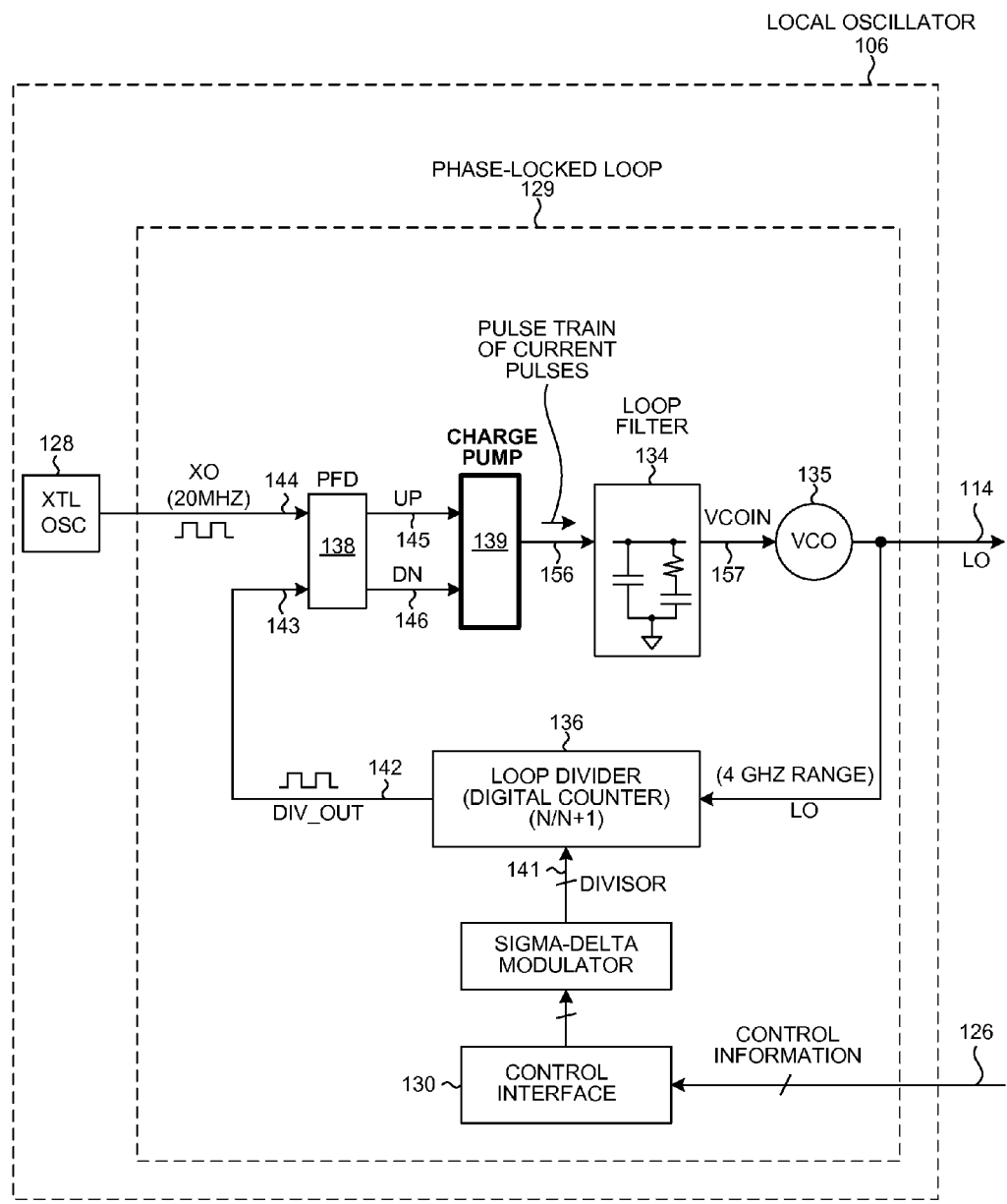
FIG. 4 is a circuit diagram that shows local oscillator 106 of FIG. 3 in further detail.

FIG. 4 is a circuit diagram that shows local oscillator 106 of FIG. 3 in further detail. Local oscillator 106 includes a source 128 of a reference clock signal XO and a Phase-Locked Loop (PLL) 129. Source 128 may be a crystal oscillator, or a portion of an oscillator, or another source of the reference clock signal XO such as a conductor through which the reference clock signal XO is communicated. Source 128 supplies the reference clock signal XO onto a first input lead 144 of a Phase-Frequency Detector (PFD) 138. The control information received via conductors 126 is used to control a loop divider 136. Loop divider 136 frequency divides the single-bit local oscillator output signal LO by a multi-bit digital divisor value on conductors 141, and outputs the resulting divided-down single-bit feedback signal DIV_OUT onto conductor 142 and to a second input lead 143 of PFD 138. PLL 129 includes the Phase-Frequency Detector (PFD) 138, a charge pump 139, a loop filter 134, a Voltage Controlled Oscillator (VCO) 135, and the loop divider 136. PFD 138 receives the reference clock signal XO on its first input lead 144 and receives the feedback DIV_OUT signal on its second input lead 143. From these signals, PFD 138 generates an up charge pump control signal (UP) and a down charge pump control signal (DN). The UP and DN signals are supplied to charge pump 139 via conductors 145 and 146, respectively.

Figure 5:
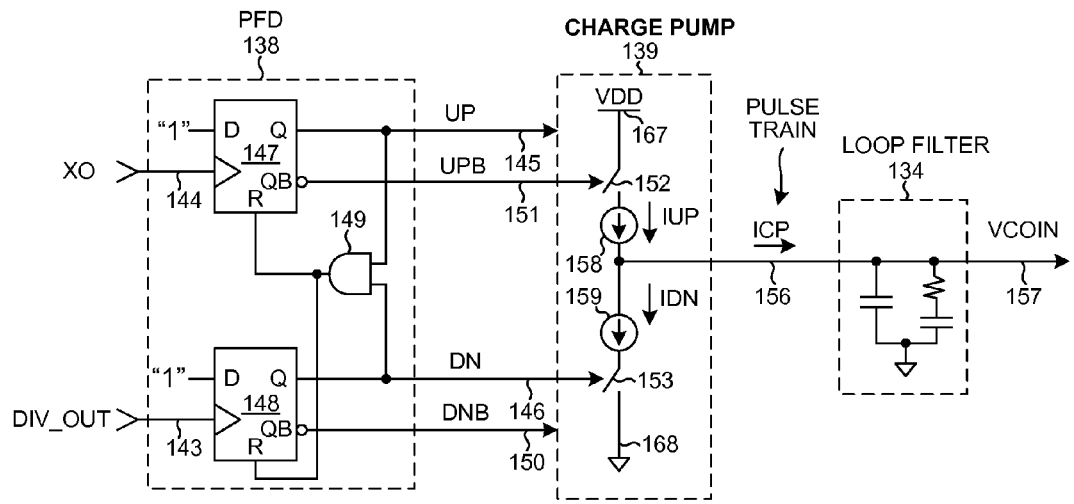
FIG. 5 is a circuit diagram that shows PFD 138, charge pump 139 and loop filter 134 of FIG. 4 in further detail.

FIG. 5 is a circuit diagram that shows PFD 138, charge pump 139 and loop filter 134 in further detail. PFD 138 includes a first flip-flop 147, a second flip-flop 148 and an AND gate 149. The circuit of FIG. 5 is but one example of a PFD circuit that can be used. This particular circuit is illustrated here for instructional purposes.

In a positive phase situation, PFD 138 works as follows. If both signals XO and DIV_OUT are initially at high digital logic levels, and if both flip-flops 147 and 148 are reset and outputting low digital logic levels, then AND gate 149 is outputting a low digital logic level and the flip-flops 147 and 148 are not in the condition of being reset. If the signal XO then transitions to a high digital logic level, then flip-flop 147 is set and the UP signal is asserted to a high digital logic level. This condition persists until the signal DIV_OUT transitions high. When the signal DIV_OUT transitions high, then flip-flop 148 is set and the signal DN is asserted high. When signal DN transitions high then both the UP and DN signals supplied onto the inputs of AND gate 149 are high. AND gate 149 therefore outputs a digital logic high value which asynchronously resets both flip-flops 147 and 148. Both signals UP and DN are then quickly deasserted to have low digital logic levels. At this point shortly following the low-to-high transition of signal DN, the PFD 138 is in its reset condition and is ready to measure the phase of another rising edge condition. The amount of time the signal DN is asserted high is the amount of time required to asynchronously reset flip-flops 147 and 148 through AND gate 149. The amount of time the signal UP is asserted high, however, varies depending on the phase difference between the rising edge of XO and the rising edge of DIV_OUT. The larger the phase difference, the longer the signal UP is asserted high.

In a negative phase situation, PFD 138 works as follows. If both signals XO and DIV_OUT are initially at low digital logic levels, and if both flip-flops 147 and 148 are reset and are outputting low digital logic levels, and if the signal DIV_OUT then transitions to a high digital logic level before the signal XO, then flip-flop 148 is set. The DN signal is asserted high. This condition persists until the signal XO transitions high. When the signal XO transitions high, then flip-flop 147 is set and the signal UP is asserted high. At this point both signals UP and DN are high. The AND gate 149 therefore outputs a high digital logic level which asynchronously resets both flip-flops 147 and 148. Both signals UP and DN are deasserted to have low digital logic levels. The PFD 138 is then prepared to measure another rising edge condition. The amount of time the signal UP is asserted high is the amount of time required to asynchronously reset flip-flops 147 and 148 through AND gate 149. The amount of time the signal DN is asserted high, however, varies depending on the phase difference between the rising edge of DIV_OUT and the rising edge of XO. The larger the phase difference, the longer DN is asserted high.

The illustration of charge pump 139 in FIG. 5 is a simplification. In the simplification, charge pump 139 includes a first switch 152 and a second switch 153 which are controlled (i.e. controlled to switch on and off) by the UPB and DN signals generated by PFD 138, respectively. Charge pump 139 further includes a first current source 158 and second current source 159. The first switch 152 controls the flow of IUP current, and the second switch 153 controls the flow of IDN current. The UPB signal generated by PFD 138 is supplied via conductor 151 and controls switch 152. The DN signal generated by PFD 138 is supplied via conductor 146 and controls switch 153. PFD 139 additionally supplies a signal UPB via conductor 151 and signal DNB via conductor 150 to the charge pump 139. Signals UP and DNB control replica circuits (not illustrated in FIG. 5). When the control signal UPB received via conductor 151 has a low digital logic level, current IUP flows from supply node 167, through the first switch 152, through first current source 158, and then onto conductor 156. When the control signal DN received via conductor 146 has a high digital logic level, charge is drawn from conductor 156, through second current source 159, through the second switch 153 and then to a ground node 168. If during a phase-measuring rising XO/DIV_OUT edge condition, the signal UP is high (and UPB is low) longer than the signal DN is high, then more charge is supplied onto conductor 156 via IUP current flow than is removed from conductor 156 via IDN current flow. The result is a pulse of positive current ICP. If, on the other hand, during a phase-measuring rising XO/DIV_OUT edge condition the signal DN is high longer than the signal UP is high, then less charge is supplied onto conductor 156 via IUP current flow than is removed from conductor 156 by IDN current flow. The result is a pulse of negative current ICP. The positive and negative ICP pulses together constitute a charge pump current pulse train signal ICP. Pulse train signal ICP is supplied to loop filter 134 via conductor 156. In this example, loop filter 134 is a low-pass filter. After low-pass filtering pulse train signal ICP, loop filter 134 supplies signal VCOIN via conductor 157 as illustrated in FIG. 5. The illustration of loop filter 134 presented in FIG. 5 is a simplification that is provided here for illustration purposes.

Figure 6:
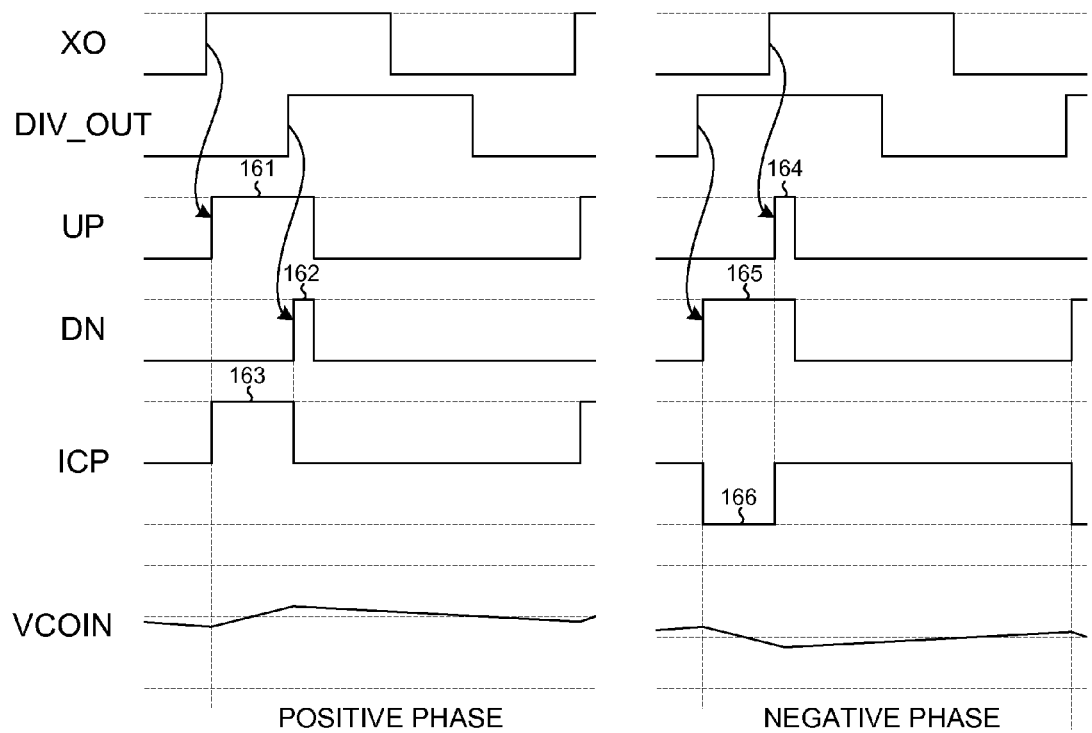
FIG. 6 is a diagram of idealized waveforms illustrating operation of the PFD 138, charge pump 139 and loop filter 134 of FIG. 5.

FIG. 6 is a diagram of idealized waveforms illustrating operation of the circuit of FIG. 5. The waveforms on the left side of FIG. 6 illustrate a positive phase condition. The pulse 161 of signal UP is longer than the pulse 162 of signal DN resulting in a positive pulse 163 of current ICP. The waveforms on the right side of FIG. 6 illustrated a negative phase condition. The pulse 164 of signal UP is shorter than the pulse 165 of signal DN resulting in a negative pulse 166 of current ICP.

Figure 7:
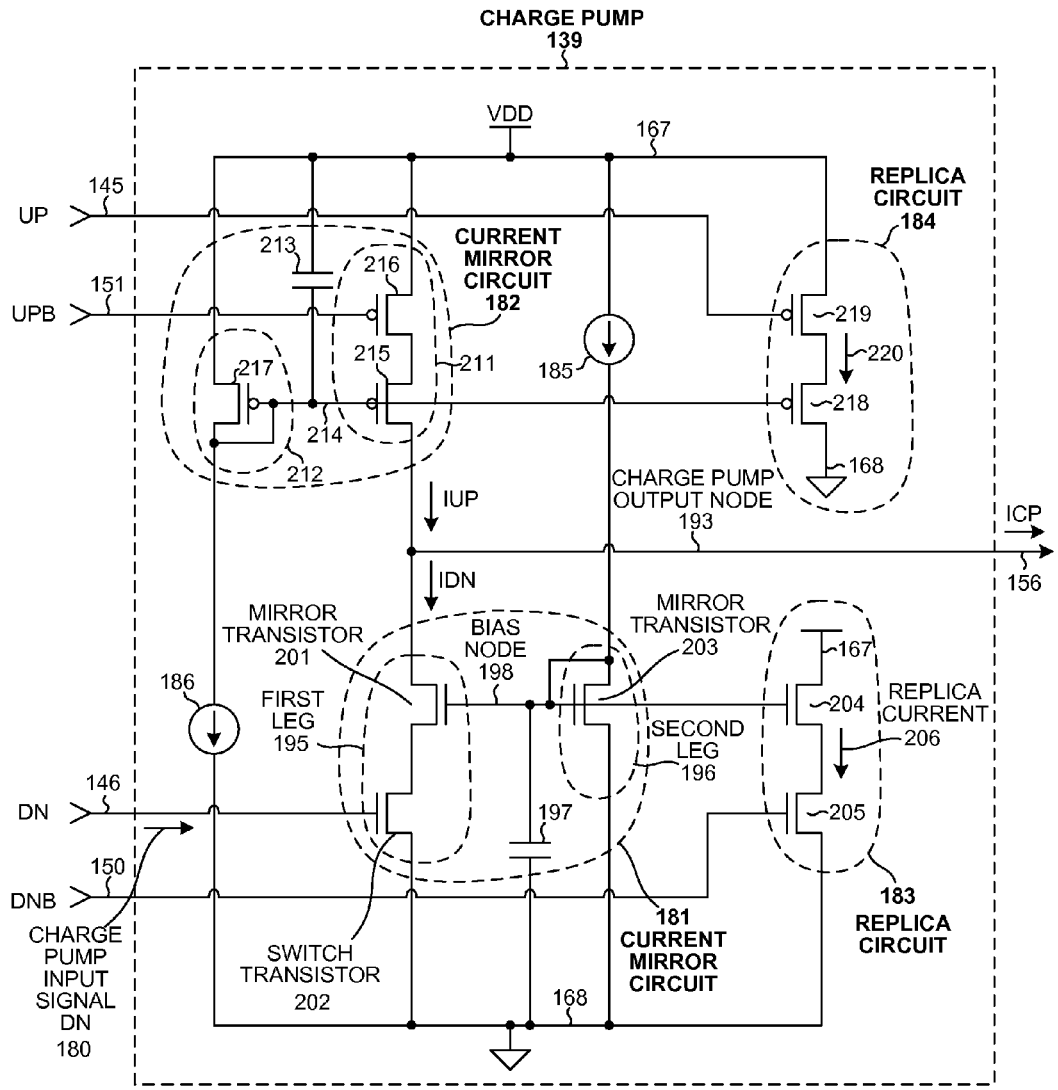
FIG. 7 is a circuit diagram that shows a first embodiment of charge pump 139 of FIG. 5 in further detail.

FIG. 7 is a circuit diagram that shows charge pump 139 of FIG. 5 in further detail. Charge pump 139 includes a DN current mirror circuit 181, UP current mirror circuit 182, a DN first leg replica circuit 183, an UP first leg replica circuit 184, a DN current source 185, and an UP current source 186. Charge pump 139 outputs charge pump current pulse train signal ICP onto a charge pump output node 193. Conductor 156 is part of charge pump output node 193.

DN current mirror circuit 181 includes a first leg 195, a second leg 196, and a capacitor 197. The first leg 195 further includes a N-channel mirror transistor 201 and a N-channel switch transistor 202. The gate of mirror transistor 201 is coupled to a DN bias node 198. The gate of switch transistor 202 is coupled to conductor 146 and is controlled by signal DN. Mirror transistor 201 and mirror transistor 203 form a current mirror. If switch transistor 202 is turned on, then the current flowing from supply node 167, through current source 185, and through second leg 196, is mirrored onto first leg 195 and current IDN flows from charge pump output node 193 through the first leg 195 and to ground node 168.

DN first leg replica circuit 183 further includes a first N-channel transistor 204 and a second N-channel transistor 205. First transistor 204 and second transistor 205 are said to form a "replica circuit" because their geometries and layout are substantially identical to the transistors of first leg 195 of the DN current mirror circuit 181. Hence, first transistor 204 has identical width and length dimensions as mirror transistor 201, and second transistor (or switch transistor) 205 has identical width dimensions and length dimensions as switch transistor 202. The gate of first transistor 204 is coupled to bias node 198 of the current mirror circuit 181. The gate of second transistor 205 is coupled to conductor 150 and is controlled by the signal DNB. If signal DNB is asserted high and the voltage at bias node 198 is sufficient to turn on first transistor 204, then a replica current 206 flows from supply node 167, through first transistor 204, through second transistor 205 and to ground node 168.

UP current mirror circuit 182 includes a first leg 211, a second leg 212, and a capacitor 213. The first leg 211 further includes a P-channel mirror transistor 215 and a P-channel switch transistor 216. The gate of mirror transistor 215 is coupled to an UP bias node 214. The gate of switch transistor 216 is coupled to conductor 151 and controlled by signal UPB, an inverted version of signal UP. Second leg 212 further includes a P-channel mirror transistor 217. The gate of mirror transistor 217 is coupled to bias node 214. Mirror transistor 215 and mirror transistor 217 form a current mirror. If switch transistor 216 is turned on, then the current flowing from supply node 167 through second leg 212, is mirrored onto first leg 211 and current IUP flows from supply node 167, through first leg 211, and onto charge pump output node 193.

UP first leg replica circuit 184 further includes a first P-channel transistor 218 and a second P-channel transistor 219. First transistor 218 and second transistor 219 are said to form a "replica circuit" because their geometries and layout are substantially identical to the transistors of first leg 211 of the UP current mirror circuit 182. Hence, first transistor 218 has identical width and length dimensions to mirror transistor 215, and second transistor (or switch transistor) 219 has identical width and length dimensions to switch transistor 216. The source of first transistor 218 is coupled to the drain of second transistor 219, and the drain of first transistor 218 is coupled to ground node 168. The gate of first transistor 218 is coupled to the bias node 214 of the current mirror circuit 182. The source of second transistor 219 is coupled to supply node 167. The gate of second transistor 219 is coupled to conductor 145 and is controlled by the signal UP. If signal UP is transitions from a high digital logic level to a low digital logic level, and the voltage at bias node 214 is sufficiently low to turn on first transistor 218, then a replica current 220 flows from the supply node 167, through second transistor 219, through first transistor 218 and to ground node 168.

In operation, when signal DN goes high, then current IDN is made to flow through first leg 195. The magnitude of current IDN is set by the current flowing through current source 185. When the current is made to flow through DN current mirror circuit 181, there are perturbations on DN bias node 198, and when current is made to stop flowing through DN current mirror circuit 181, there are other perturbations. One example of a perturbation on DN bias node 198 is a voltage disturbance. By providing the DN first leg replica circuit 183 that switches in an opposite fashion to DN current mirror circuit 181, where the transistors of DN first leg replica circuit 183 are replicas of corresponding transistors in the DN first leg circuit 195, the voltage disturbance caused by turning on the DN current mirror circuit 181 are counteracted by opposite voltage disturbances when the first leg replica circuit 183 is turned off. Similarly, UP first leg replica circuit 184 tends to counteract voltage disturbances on UP bias node 214 caused by switching the UP current mirror circuit 182.

Figure 8:
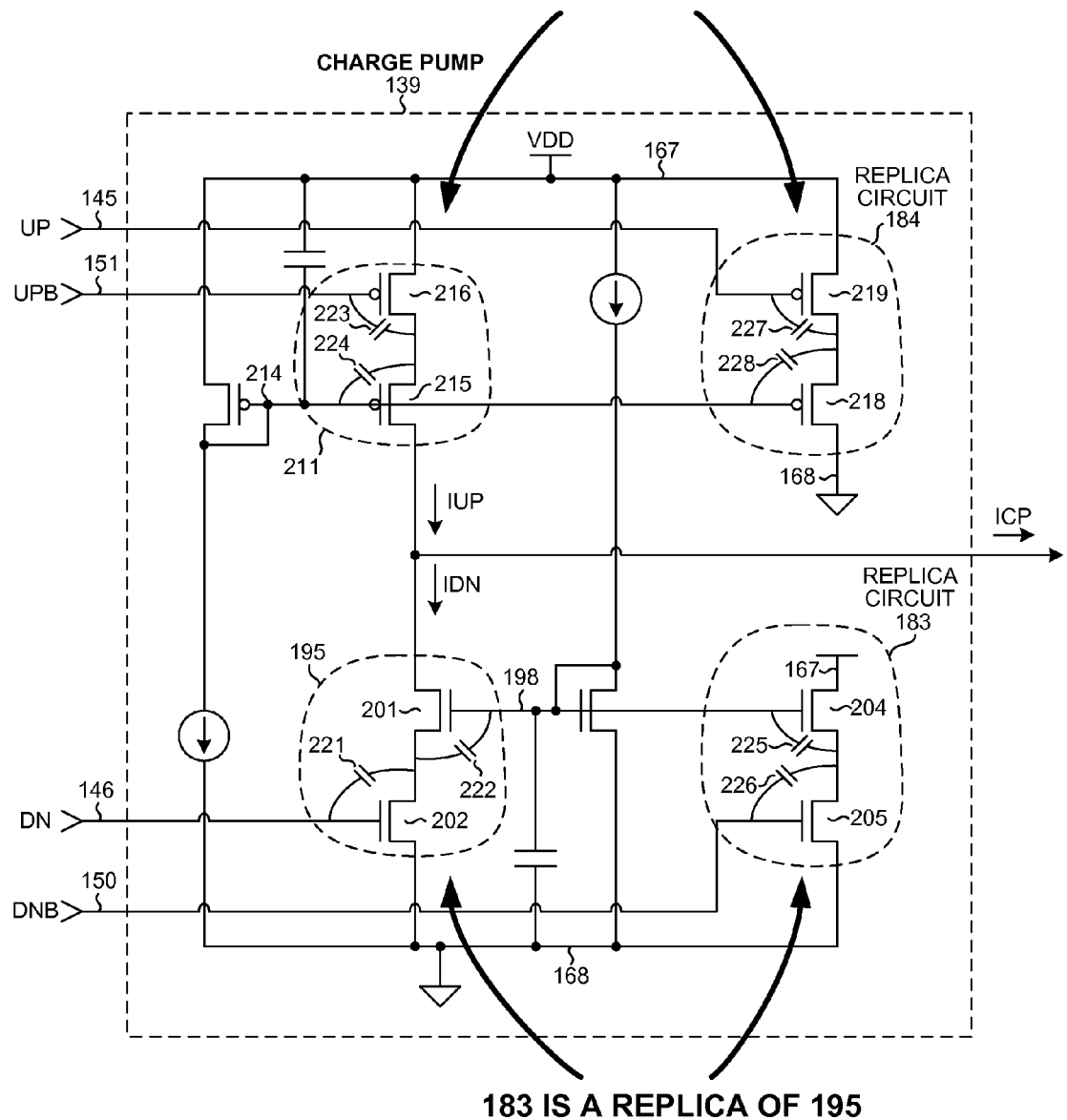
FIG. 8 is a circuit diagram of charge pump 139 illustrating one type of coupling which tends to affect operation of charge pump 139.

FIG. 8 is a circuit diagram of charge pump 139 illustrating one type of parasitic coupling which tends to affect operation of charge pump 139. In some cases, parasitic capacitances are present in charge pump 139 and tend to cause voltage disturbances on DN bias node 198 and UP bias node 214. Parasitic coupling exists between DN conductor 146 and DN bias node 198 (through parasitic capacitances 221 and 222). Thus when a DN signal on conductor 146 transitions, the voltage on DN bias node 198 is disturbed. Similarly, parasitic coupling also exists between UPB conductor 151 and UP bias node 214 (through parasitic capacitances 223 and 224). Thus when an UPB signal on conductor 151 transitions, the voltage on UP bias node 214 is disturbed. However, this is only a simplified explanation of one type of phenomenon tending to cause such voltage disturbances. In reality, there are many coupling mechanisms at work.

Replica circuit 183 and 184 are provided to reduce the effect of these voltage disturbances on bias nodes 198 and 214. DN replica circuit 183 exhibits parasitic coupling between DNB conductor 150 and DN bias node 198 (through parasitic capacitances 226 and 225). Because first leg circuit 195 and replica circuit 183 are identical and are clocked by opposite polarity signals, disturbances on DN bias node 198 caused by transitioning of signal DN, tend to be counteracted by equal and opposite voltage disturbances created by replica circuit 183 during transition of signal DNB. There is a coupling effect between a transition of the charge pump input signal DNB on node 150 and a voltage on bias node 198 that counteracts a coupling effect between a corresponding transition of the charge pump input signal DN on node 146 and the voltage on bias node 198.

Similarly, UP replica circuit 184 exhibits parasitic coupling between UP conductor 145 and UP bias node 214 (through parasitic capacitances 227 and 228). Because first leg circuit 211 and replica circuit 184 are identical and are clocked by opposite polarity signals, disturbances on UP bias node 214 caused by transitioning of signal UPB, tend to be counteracted by an equal and opposite voltage disturbance created by replica circuit 184 during transition of signal UP.

Figure 9:
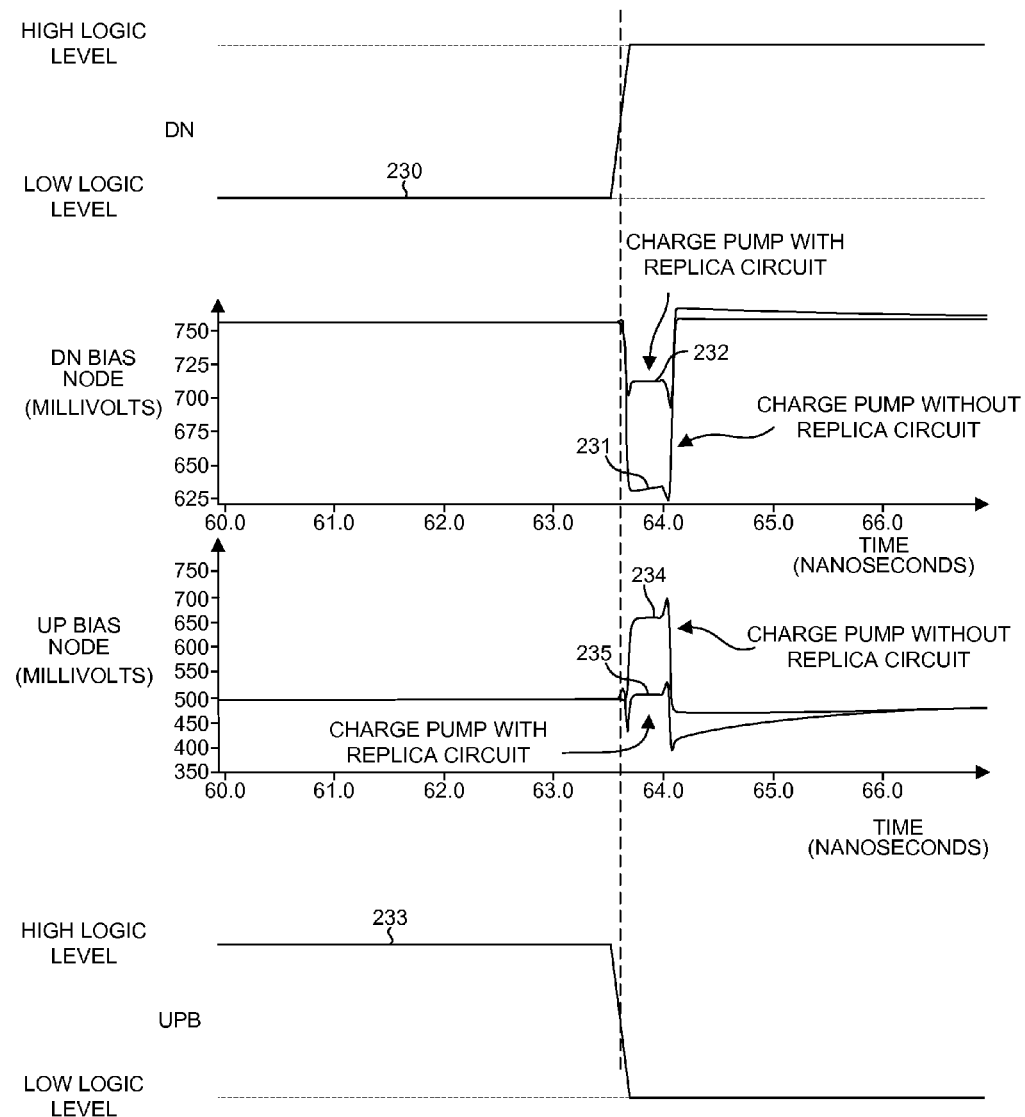
FIG. 9 is a waveform diagram illustrating voltage disturbances on charge pump bias nodes caused by transitioning of charge pump input signals.

FIG. 9 is a waveform diagram illustrating voltage disturbances on the bias nodes 198 and 214 caused during transitioning of the charge pump input signals DN and UPB. In one example operation of the charge pump 139 of FIG. 7, the rising transition of signal DN, from a low digital logic level to a high digital logic level (waveform 230), creates a voltage disturbance on the DN bias node 198 (see FIG. 7). The waveforms labeled DN BIAS NODE show the voltage (millivolts) on DN bias node 198 of FIG. 7 plotted over time (nanoseconds) during a transition of signal DN when charge pump 139 operates with replica circuit 183 and in another case as if replica circuit 183 were not included. Waveform 231 represents the voltage at DN bias node 198 if charge pump 139 were to operate without replica circuit 183. Waveform 232 represents the voltage at DN bias node 198 when charge pump 139 operates with replica circuit 183 as in FIG. 7. Waveform 231 indicates that the DN bias voltage dips to approximately 625 mV if the replica circuit is removed and not utilized. Waveform 232 indicates that the DN bias voltage only falls to approximately 690 mV when replica circuit 183 is utilized. Hence voltage disturbances on DN bias node are reduced by utilizing replica circuit 183.

Similarly, the falling transition of signal UPB (waveform 233), from a high digital logic level to a low digital logic level, creates a voltage disturbance on UP bias node 214. The waveforms labeled UP BIAS NODE show the voltage (millivolts) on UP bias node 214 of FIG. 7 plotted over time (nanoseconds) during a transition of signal UPB when charge pump 139 operates with replica circuit 184 and in another case as if replica circuit 184 were not included. Waveform 234 represents the voltage at UP bias node 214 if charge pump 139 were to operate without replica circuit 184. Waveform 235 represents the voltage at UP bias node 214 when charge pump 139 operates with replica circuit 184 as in FIG. 7. Waveform 234 indicates that the UP bias voltage rises to approximately 700 mV on transition of signal UPB when replica circuit 184 is removed and not utilized. Waveform 235 indicates that the UP bias voltage only rises to approximately 525 mV when replica circuit 184 is utilized. Hence voltage disturbances on UP bias node are reduced by utilizing replica circuit 184.

Figure 10:
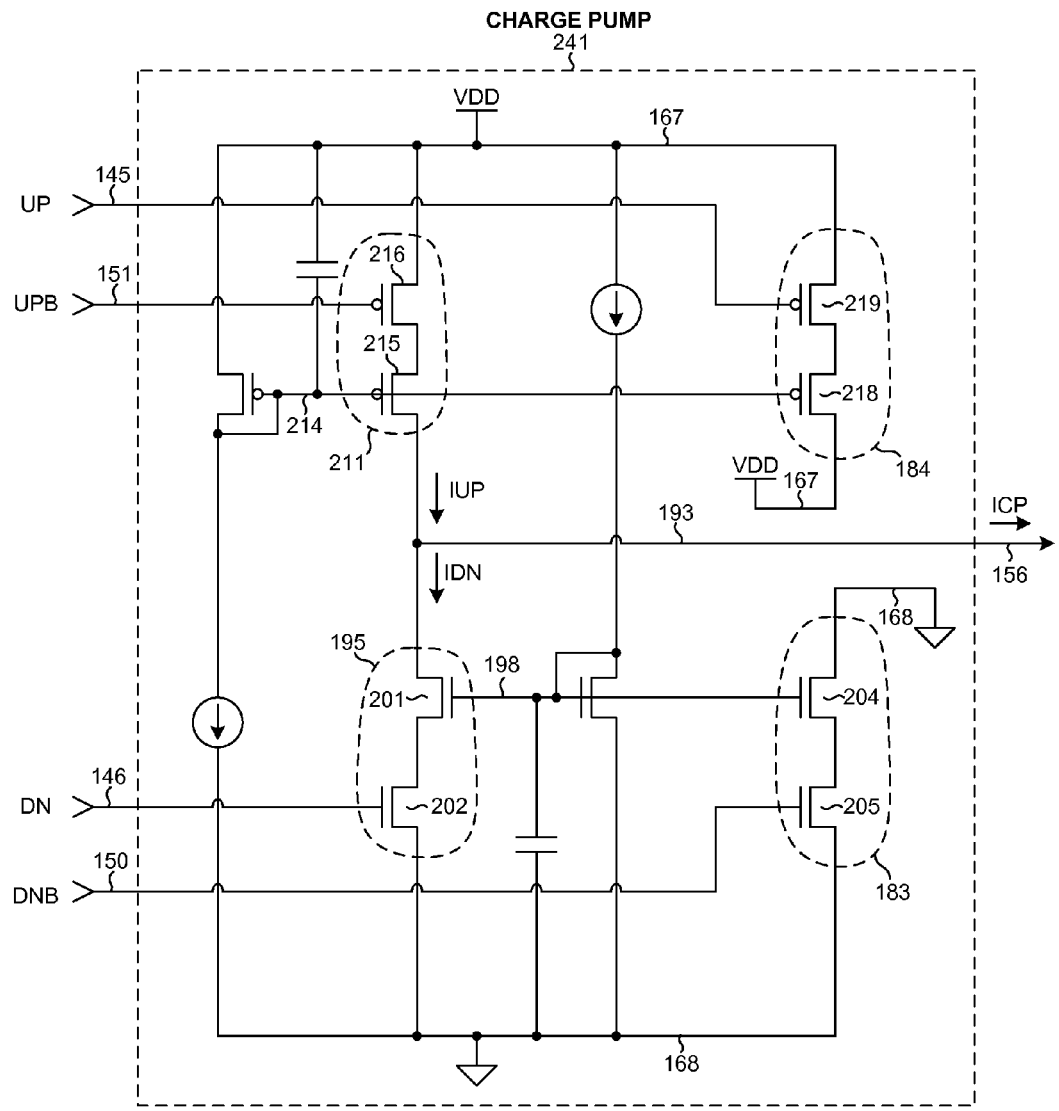
FIG. 10 is a circuit diagram that shows a second embodiment of charge pump 139 of FIG. 5 which consumes less power.

FIG. 10 is a circuit diagram of a second embodiment of charge pump 139 of FIG. 5 which consumes less power. Charge pump 241 is nearly identical to charge pump 139 illustrated in FIG. 7, except that replica circuits 183 and 184 are not coupled to both a supply and ground node. The absence of current flowing through replica circuits 183 and 184 results in less power consumption. DN replica circuit 183 includes a first transistor 204 and a second transistor 205 (of identical size and layout as transistor 201 and 202 respectively.) However, because the drain of first transistor 204 is coupled to a ground node and the source of second transistor 205 is coupled to the ground node, minimal current flows through DN replica circuit 183 when transistor 205 is controlled to be on and conductive. Similarly, UP replica circuit 184 includes a first transistor 218 and a second transistor 219 (of identical size and layout as transistor 215 and 216 respectively.) However, because the drain of first transistor 218 is coupled to a supply node and the source of second transistor 219 is coupled to the supply node, minimal current flows through UP replica circuit 184. As a result, less power is consumed by charge pump 241 due to the minimized current flowing through replica circuits 183 and 184.

Figure 11:
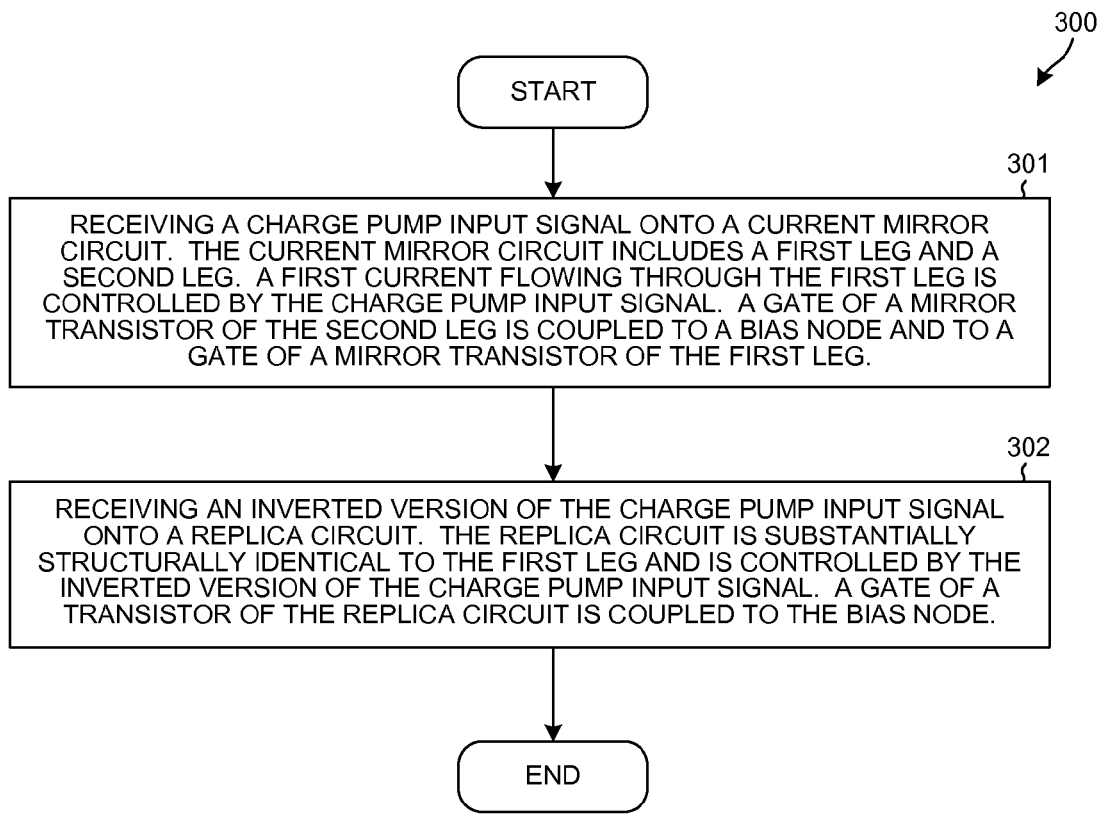
FIG. 11 is a simplified flowchart of a method in accordance with one novel aspect.

FIG. 11 is a flowchart of a method 300 in accordance with one novel aspect. In a first step (step 301), a charge pump input signal is received onto a current mirror circuit. The current mirror circuit includes a first leg and a second leg. For example, in FIG. 7, input signal DN is received onto charge pump input node and conductor 146 and onto the gate of transistor 202 of current mirror circuit 181. Current mirror circuit 181 includes a first leg 195 and a second leg 196. The first step (step 301) further involves mirroring a current flowing through the second leg to a current flowing through the first leg. In the first step (step 301), the first current is controlled (i.e., is controlled to switch on and off) by the charge pump input signal DN, and a gate of mirror transistor 203 of second leg 196 is coupled to bias node 198 and to a gate of mirror transistor 201 of first leg 195. As illustrated in FIG. 7, input signal DN controls switch transistor 202, which in turn controls flow of current IDN through first leg 195.

In a second step (step 302), an inverted version of the charge pump input signal is received onto a replica circuit that is substantially structurally identical to the first leg. As illustrated in FIG. 7, input signal DNB (an inverted version of signal DN) is received onto input node and conductor 150 and onto the gate of transistor 205 of DN first leg replica circuit 183. The gate of transistor 204 of the DN replica circuit 183 is coupled to the bias node 198.

Although certain specific embodiments are described above for instructional purposes, the teachings of this patent document have general applicability and are not limited to the specific embodiments described above. Accordingly, various modifications, adaptations, and combinations of the various features of the described specific embodiments can be practiced without departing from the scope of the claims that are set forth below.

What is claimed is:

1. An apparatus comprising:
a current mirror circuit including a first leg and a second leg, wherein a first current flowing through the first leg from a charge pump output node to a ground node is mirrored to a second current flowing through the second leg to the ground node, wherein the current minor circuit is adapted to initiate the first current flowing through the first leg in response to a transition of a charge pump input signal, wherein a gate of a mirror transistor of the second leg is coupled to a bias node and to a gate of a mirror transistor of the first leg, and wherein there is a first coupling effect between the transition of the charge pump input signal and a voltage on the bias node; and
a replica circuit that is substantially structurally identical to the first leg, wherein the replica circuit is adapted to receive an inverted version of the charge pump input signal and reduce a voltage disturbance on the bias node by inducing a second coupling effect between a transition of the inverted version of the charge pump input signal and the voltage on the bias node, and wherein the first coupling effect and the second coupling effect have opposite magnitudes.

2. The apparatus of claim 1, wherein the replica circuit is further adapted to conduct a replica current controlled by the inverted version of the charge pump input signal from a supply node to the ground node.

3. The apparatus of claim 2, wherein the replica current flows from the supply node, through a first transistor of the replica circuit having a gate coupled to the bias node, then through a second transistor of the replica circuit, and then to the ground node, and wherein the inverted version of the charge pump input signal is coupled to a gate of the second transistor of the replica circuit.

4. The apparatus of claim 1, wherein a transistor of the replica circuit has a drain coupled to at least one of a ground node, a supply voltage node, or a node that carries a Direct Current (DC) voltage.

5. The apparatus of claim 1, wherein the first current flows when the charge pump input signal has a first logic level, and wherein the first current does not flow when the charge pump input signal has a second logic level.

6. The apparatus of claim 1, wherein the first leg includes the minor transistor and a switch transistor, wherein the first current flows from the charge pump output node, through the minor transistor of the first leg, then through the switch transistor of the first leg, and then to the ground node, and wherein the charge pump input signal is coupled to a gate of the switch transistor.

7. The apparatus of claim 1, wherein the first leg includes the minor transistor and a switch transistor, wherein the first current flows from the charge pump output node, through the minor transistor of the first leg, then through the switch transistor of the first leg, and then to the ground node, wherein the replica circuit includes a first transistor having a gate coupled to the bias node and a second transistor having a gate coupled to the inverted version of the charge pump input signal, wherein the minor transistor of the first leg and the first transistor of the replica circuit are both N-channel transistors that have identical width dimensions and identical length dimensions, and wherein the switch transistor of the first leg and the second transistor of the replica circuit are both N-channel transistors that have identical width dimensions and identical length dimensions.

8. The apparatus of claim 2, further comprising:
a second current mirror circuit including a first leg and a second leg, wherein a third current flowing from a supply node through the first leg of the second current minor circuit to the charge pump output node is mirrored to a fourth current flowing from the supply node through the second leg of the second current minor circuit, wherein the third current is controlled by a second charge pump input signal, and wherein a gate of a minor transistor of the second leg of the second current mirror circuit is coupled to a second bias node and to a gate of a mirror transistor of the first leg of the second current minor circuit; and
a second replica circuit that is substantially structurally identical to the first leg of the second current minor circuit, wherein the second replica current is adapted to conduct a second replica current controlled by an inverted version of the second charge pump input signal from the supply node to the ground node, and wherein a gate of a transistor of the second replica circuit is coupled to the second bias node.

9. The apparatus of claim 1, wherein the charge pump input signal and the inverted version of the charge pump input signal are received from a phase detector.

10. A method comprising:
receiving a charge pump input signal onto a current mirror circuit, wherein the current minor circuit includes a first leg and a second leg;
initiating, by the current mirror circuit, a first current flowing through the first leg from a charge pump output node to a ground node in response to a transition of a charge pump input signal, wherein the first current flowing through the first leg is mirrored to a second current flowing through the second leg to the ground node, wherein a gate of a minor transistor of the second leg is coupled to a bias node and to a gate of a mirror transistor of the first leg, and wherein there is a first coupling effect between the transition of the charge pump input signal and a voltage on the bias node;
receiving an inverted version of the charge pump input signal onto a replica circuit that is substantially structurally identical to the first leg;
conducting a replica current controlled by the inverted version of the charge pump input signal from a supply node to the ground node; and
inducing a second coupling effect between a transition of the inverted version of the charge pump input signal and the voltage on the bias node to reduce a voltage disturbance on the bias node, wherein the first coupling effect and the second coupling effect have opposite magnitudes.

11. The method of claim 10, wherein the charge pump input signal controls the first current by enabling a flow of the first current when the charge pump input signal has a first logic level and disabling the flow of the first current when the charge pump input signal has a second logic level.

12. The method of claim 10, wherein the first leg includes the mirror transistor and a switch transistor, wherein the first current flows from the charge pump output node, through the minor transistor of the first leg, then through the switch transistor of the first leg, and then to the ground node, and wherein the charge pump input signal is received onto a gate of the switch transistor.

13. The method of claim 10, wherein the replica current flows from the supply node, through a first transistor of the replica circuit, then through a second transistor of the replica circuit, and then to the ground node, and wherein the inverted version of the charge pump input signal is received onto a gate of the second transistor of the replica circuit.

14. A charge pump comprising:
a charge pump output node;
a first current minor circuit adapted to conduct a first current from the charge pump output node to a ground node in response to a transition of a first charge pump input signal, wherein the transition of the first charge pump input signal causes a first disturbance to a voltage on a bias node of the first current minor circuit;
a first replica circuit that is substantially identical to a portion of the first current mirror circuit, wherein the first replica circuit is adapted to counteract the first disturbance to the voltage on the bias node of the first current mirror circuit using an inverted version of the first charge pump input signal, and wherein the first charge pump input signal and the inverted version of the first current charge pump input signal have opposite polarities;
a second current minor circuit adapted to conduct a second current onto the charge pump output node in response to a transition of a second charge pump input signal, wherein the transition of the second charge pump input signal causes a second disturbance to a voltage on a bias node of the second current mirror circuit; and
a second replica circuit that is substantially identical to a portion of the second current minor circuit, wherein the second replica circuit is adapted to counteract the second disturbance to the voltage on the bias node of the second current mirror circuit using an inverted version of the second charge pump input signal, and wherein the second charge pump input signal and the inverted version of the second charge pump input signal have opposite polarities.

15. The charge pump of claim 14, wherein the first charge pump input signal controls the first current minor current by enabling a flow of the first current when the first charge pump input signal has a first logic level and disabling the flow of the first current when the first charge pump input signal has a second logic level.

16. The charge pump of claim 14, wherein the first charge pump input signal, the inverted version of the first charge pump input signal, the second charge pump input signal, and the inverted version of the second charge pump input signal are received from a phase detector.

17. An apparatus comprising:
a charge pump output node;
a first charge pump input node that receives a charge pump input signal;
a second charge pump input node that receives an inverted version of the charge pump input signal;
a current mirror having a bias node, wherein the current mirror is adapted to initiate a flow of current from the charge pump output node to a ground node in response to a transition of the charge pump input signal, wherein there is a first coupling effect between the transition of the charge pump input signal and a voltage on the bias node; and
means for reducing a voltage disturbance on the bias node of the current minor by inducing a second coupling effect between a transition of the inverted version of the charge pump input signal and the voltage on the bias node, wherein the first and second coupling effects are of opposite magnitudes.

18. The apparatus of claim 17, wherein the means induces the second coupling effect such that the first and second coupling effects substantially cancel each other.

19. The apparatus of claim 17, wherein the first coupling effect includes capacitive coupling between the first charge pump input node and the bias node, and wherein the second coupling effect includes capacitive coupling between the second charge pump input node and the bias node.

20. The apparatus of claim 17, wherein the apparatus is a charge pump that receives the charge pump input signal and the inverted version of the charge pump input signal from a phase detector.

* * * * *